United States Patent [19]
Czora

[11] Patent Number: 6,025,754
[45] Date of Patent: Feb. 15, 2000

[54] ENVELOPE MODULATED AMPLIFIER BIAS CONTROL AND METHOD

[75] Inventor: William J. Czora, Penfield, N.Y.

[73] Assignee: Harris Corporation, Melbourne, Fla.

[21] Appl. No.: 09/109,269

[22] Filed: Jul. 2, 1998

Related U.S. Application Data

[60] Provisional application No. 60/064,096, Nov. 3, 1997.
[51] Int. Cl.<sup>7</sup> ................................ H03F 3/04; H02H 7/20
[52] U.S. Cl. ............................................. 330/296; 330/298
[58] Field of Search ................................... 330/296, 285, 330/136, 298, 207 P

[56] References Cited

U.S. PATENT DOCUMENTS

| | | | |
|---|---|---|---|
| 4,466,119 | 8/1984 | Peters et al. | 330/136 |
| 5,420,536 | 5/1995 | Faulkner et al. | 330/136 |
| 5,789,984 | 8/1998 | Davis et al. | 330/285 |

*Primary Examiner*—Robert Pascal
*Assistant Examiner*—Patricia T. Nguyen
*Attorney, Agent, or Firm*—Rogers & Killeen

[57] ABSTRACT

A RF amplifier and method wherein the bias current is varied dynamically as a function of the envelope of the RF modulation to increase the efficiency and improve the linearity of the amplifier. Alternatively, the supply voltage may be dynamically varied as a function of modulation envelope.

10 Claims, 6 Drawing Sheets

ENVELOPE MODULATED AMPLIFIER BIAS CONTROL AND METHOD

This application claims the priority of application Ser. No. 60/064,096 filed Nov. 3, 1997.

BACKGROUND OF THE INVENTION

This invention relates to amplifiers and more particularly to the dynamic biasing thereof.

As is well known, the bias current at the drain of a field effect transistor (FET) is a function of the bias voltage at the gate thereof. Likewise, the bias current at the collector of a bipolar transistor is a function of the bias voltage at the base thereof. The bias voltage determines the bias current.

Linearity is important in high frequency applications and significant bias current is required to maintain FETs in their linear response region. Thus Class A amplifiers are efficient at high power settings but inefficient at low power settings because of the high bias current. Class C amplifiers which have a low quiescent bias current are more efficient, but suffer from intermodulation and harmonic distortion. Thus, amplifiers with a fixed bias current as determined by a fixed bias voltage are compromises between efficiency on the one hand and the linearity and distortion performance of the amplifier on the other hand.

Accordingly, it is an object of the present invention to provide a novel amplifier and method in which the bias voltage of the amplifier, and thus the bias current, is dynamically varied as a function of the required output power of the amplifier.

It is another object of the present invention to provide a novel amplifier and method for improving the efficiency of a Class A amplifier.

It is another object of the present invention to provide a novel amplifier and method for improving the performance of a Class C amplifier.

It is yet another object of the present invention to provide a novel amplifier and method of dynamically controlling the bias of an amplifier.

It is still another object of the present invention to provide a novel amplifier and method of controlling the bias voltage of an amplifier as a function of the modulation envelope of the signal to be amplified.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
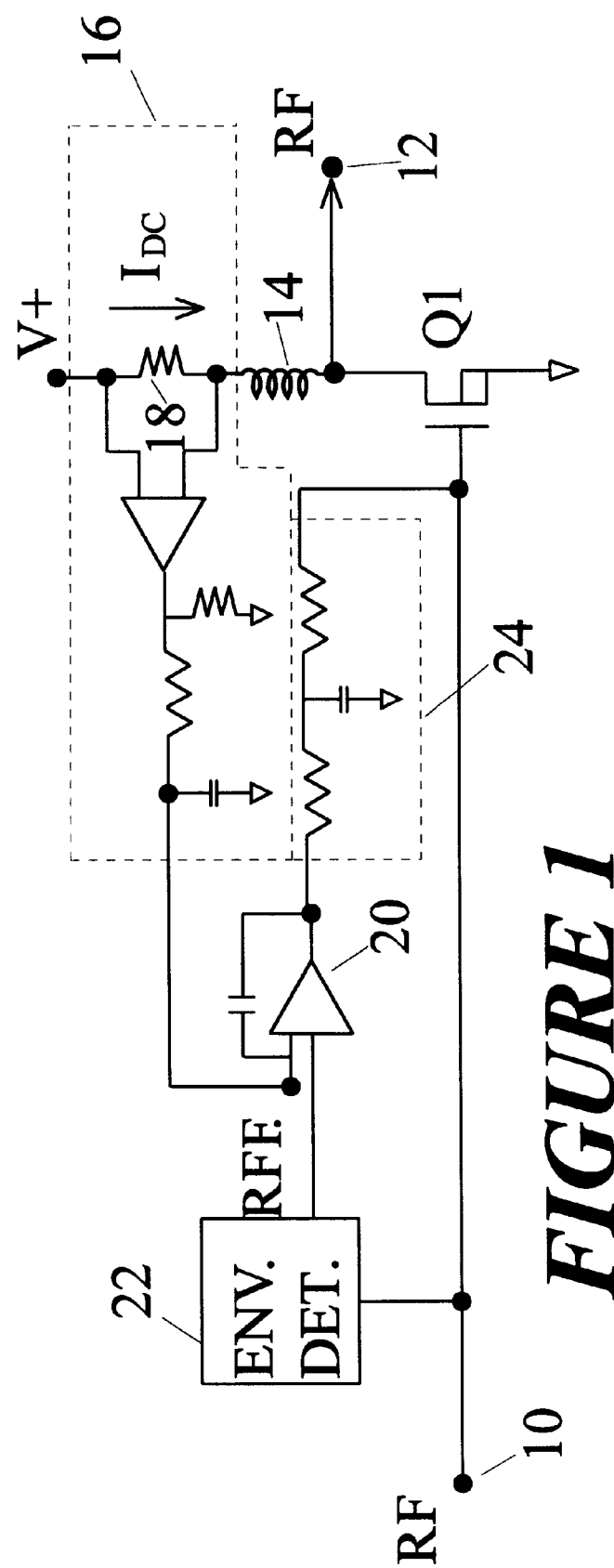
FIG. 1 is a schematic circuit diagram of one embodiment of the present invention with current control.

With reference to the embodiment of FIG. 1, an amplifier includes a grounded drain FET Q1 with a RF input signal applied to the gate thereof by way of input terminal 10 and the amplified Rf output signal taken from the source thereof by way of an output terminal 12. A positive supply voltage V+ is applied through an inductor 14 to the transistor Q1.

The d.c. current drawn by the transistor Q1 may be sensed by a differential amplifier 16 with its two input terminals connected across a small resistor 18 and its output terminal connected through a bandwidth determining filter.

The sensed d.c. current is applied to one input terminal of a differential or error amplifier 20 as a reference signal REF. The other input terminal of the amplifier 20 receives the output signal from a suitable conventional detector 22 for detecting the modulation envelope of the RF input signal applied to the input terminal 10. The modulation envelope may be measured at the input, output or intermediate stages of the amplifier as desired.

Comparison of the measured supply current with the modulation envelope of the RF signal will control the bias applied to the FET Q1. An offset must be built into one of the two signals to insure that the minimum supply current will be adequate to produce instantaneous power when required. The output signal from the amplifier 20 is applied through a RF filter 24 to provide bias voltage for the FET Q1.

The control of the d.c. supply current may be achieved without using the current as a reference voltage if desired, in which event, the envelope detector may be used to effect control of the bias current through any suitable conventional circuit.

Figure 2:
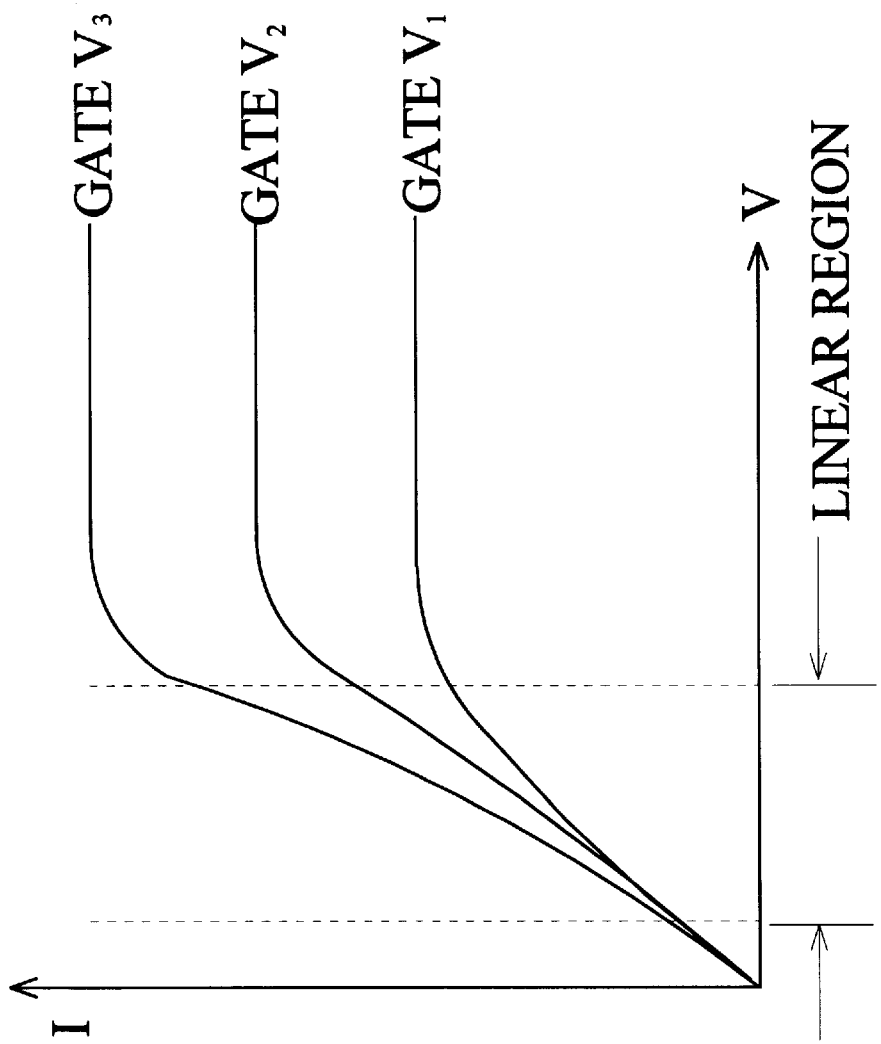
FIG. 2 is a graph illustrating the linear response of an amplifier at different gate voltages.

As shown in FIG. 2, the gate voltage may be varied to insure amplifier operation in the linear region.

Figure 3:
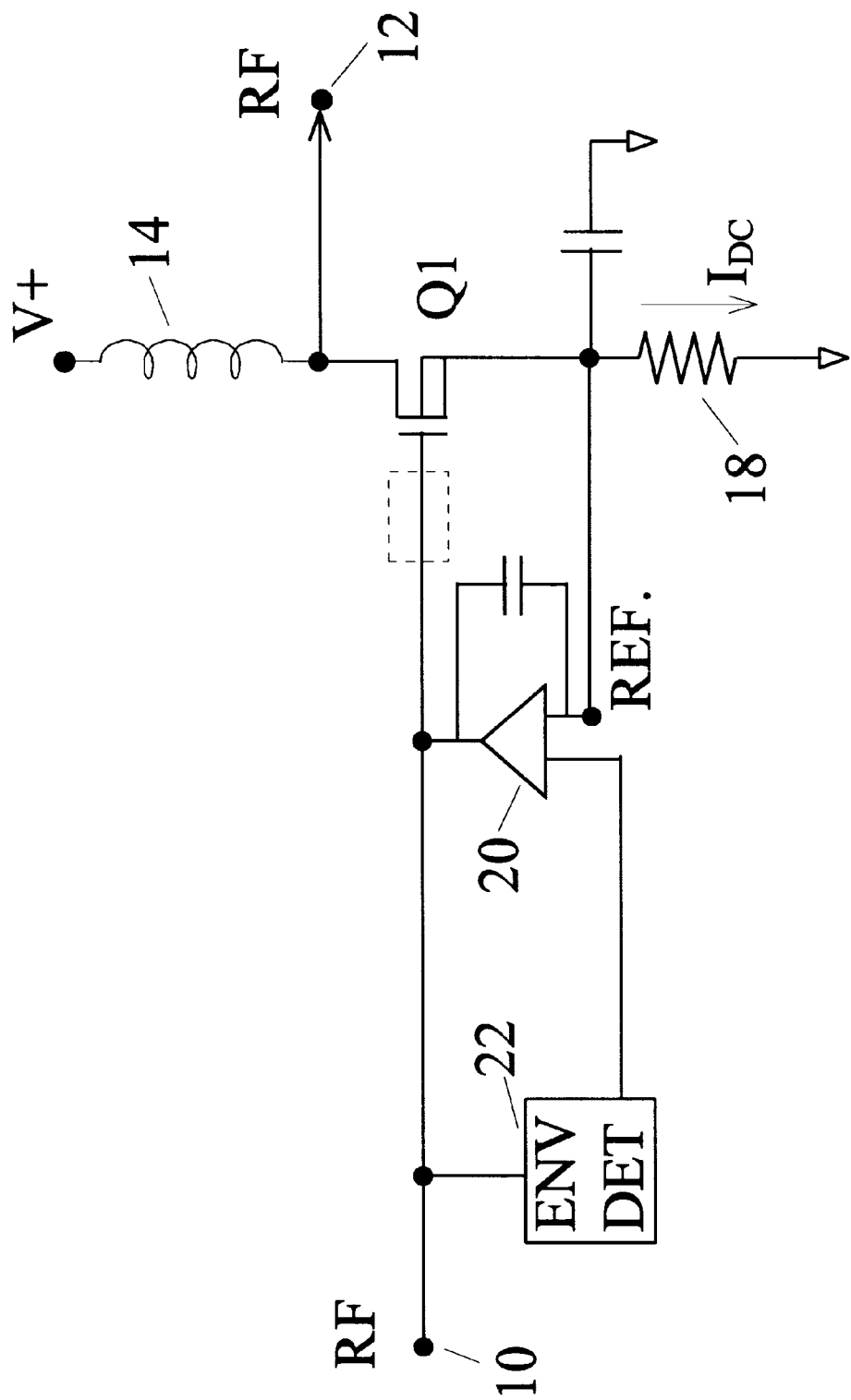
FIG. 3 is a schematic circuit diagram of a second embodiment of the present invention with current control.

As shown in FIG. 3 where like elements have been accorded like numerical designations to facilitate an understanding of the present invention, the d.c. current through the transistor Q1 may be measured with reference to ground potential by locating the sensing resistor 18 in the source circuit of the transistor Q1. As indicated above, it is not necessary to sense the supply current in order to effect control of the bias current as a function of the envelope.

Figure 4:
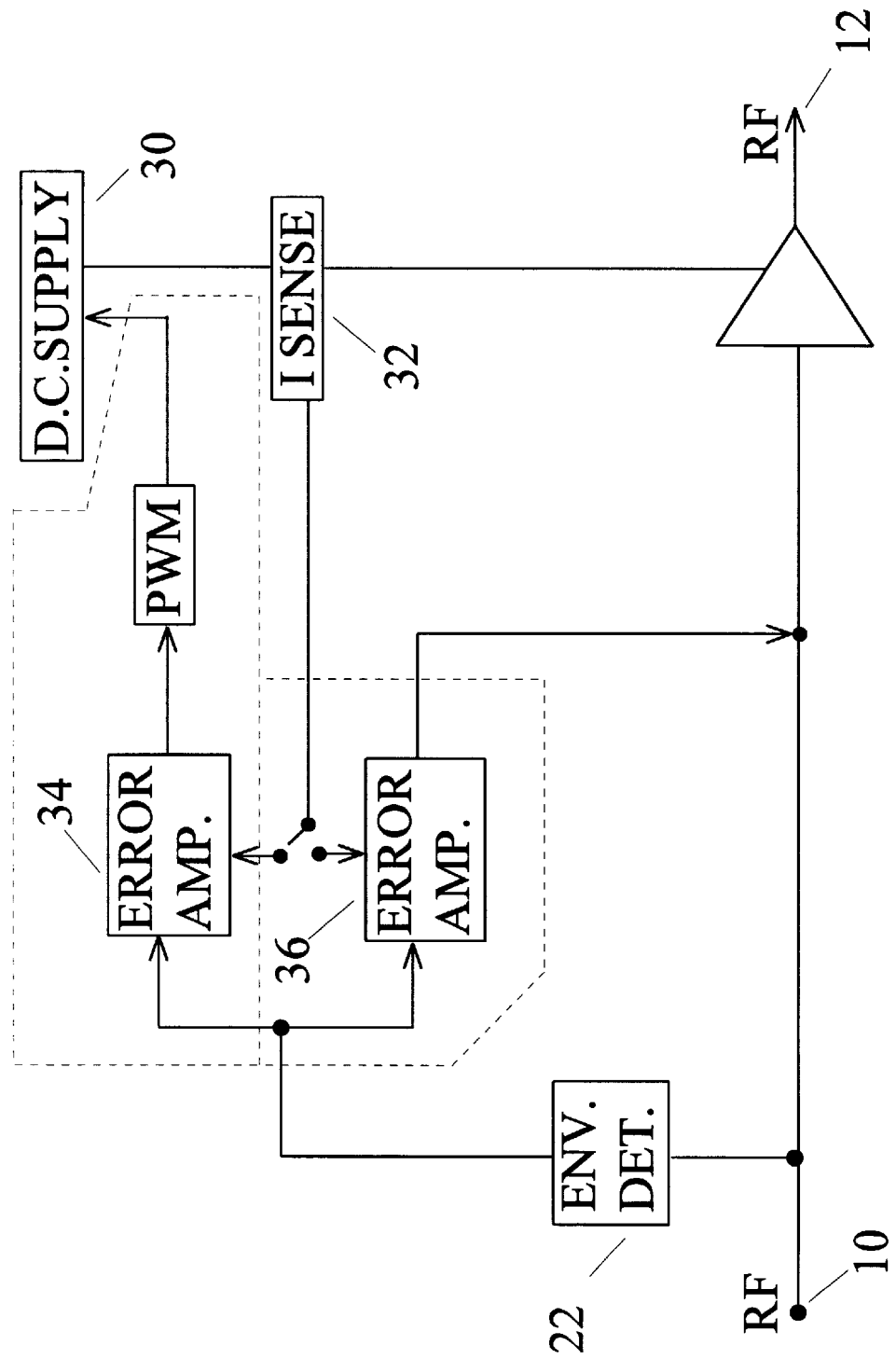
FIG. 4 is a schematic circuit diagram of a third embodiment of the present invention with both current and voltage control.

As shown in FIG. 4, it is possible to modify the d.c. power supply 30 rather than the bias current, or to modify the d.c. supply voltage in addition to modifying the bias current.

With reference to the embodiment of FIG. 4, the d.c. supply current may be sensed by a sensor 32 and applied through a switch or direct connection to one input terminal of an error amplifier 34 to which the output signal from the envelope detector 22 is applied. The error voltage from the amplifier 34 may be used to effect control of the application of power from the d.c. power supply 30 by any suitable conventional control such as the pulse width modulation shown. In this way, the supply voltage may be dynamically varied as a function of the detected envelope.

The above system of supply voltage control may be combined with the system of bias current control as earlier discussed, e.g., the sensed d.c. current may be applied to one input terminal of both of the error amplifiers 34 and 36 and both types of control simultaneously effected.

Figure 5:
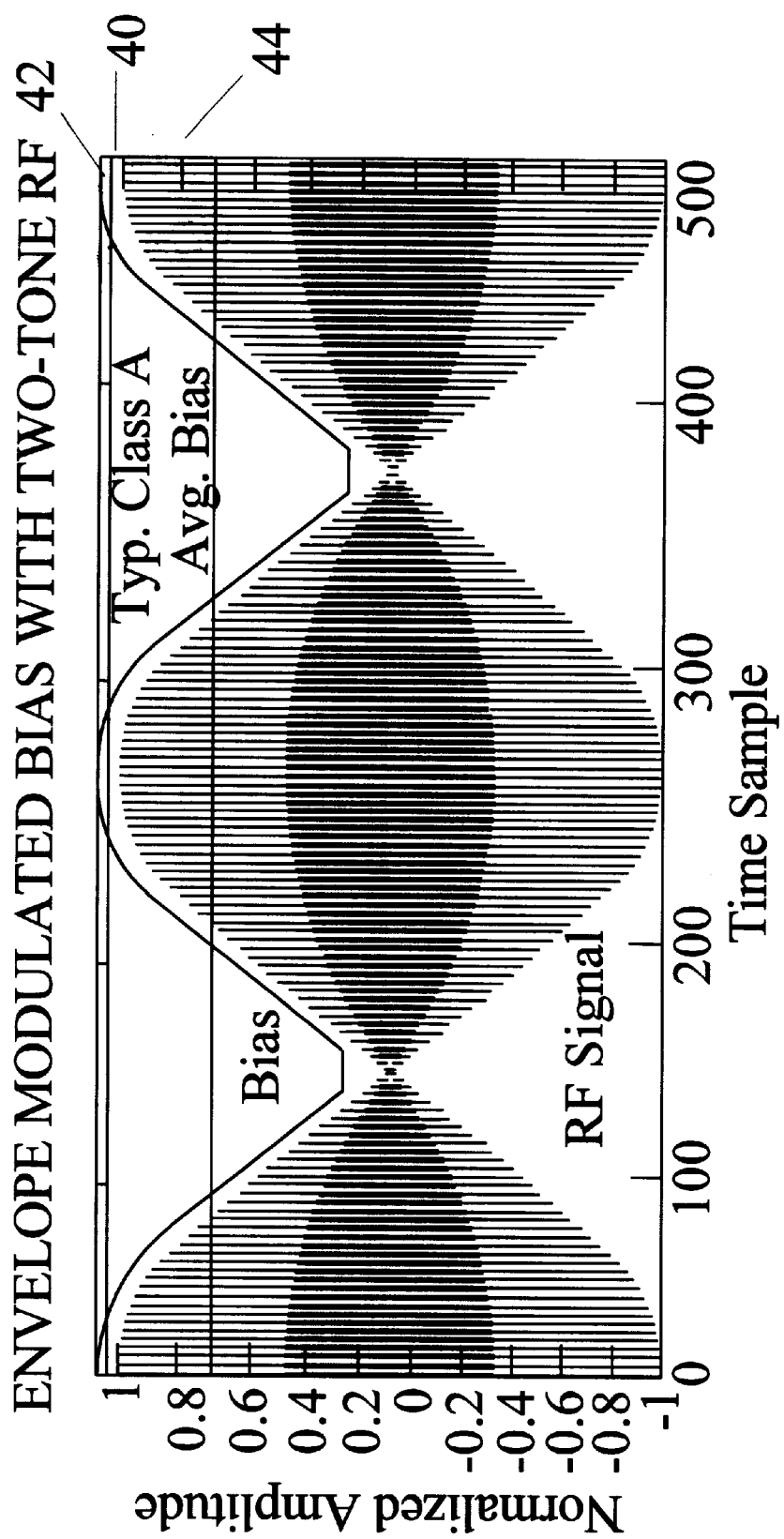
FIG. 5 is a graphical illustration of a two tone RF signal and its associated envelope modulated bias control showing both typical and average bias.
Figure 6:
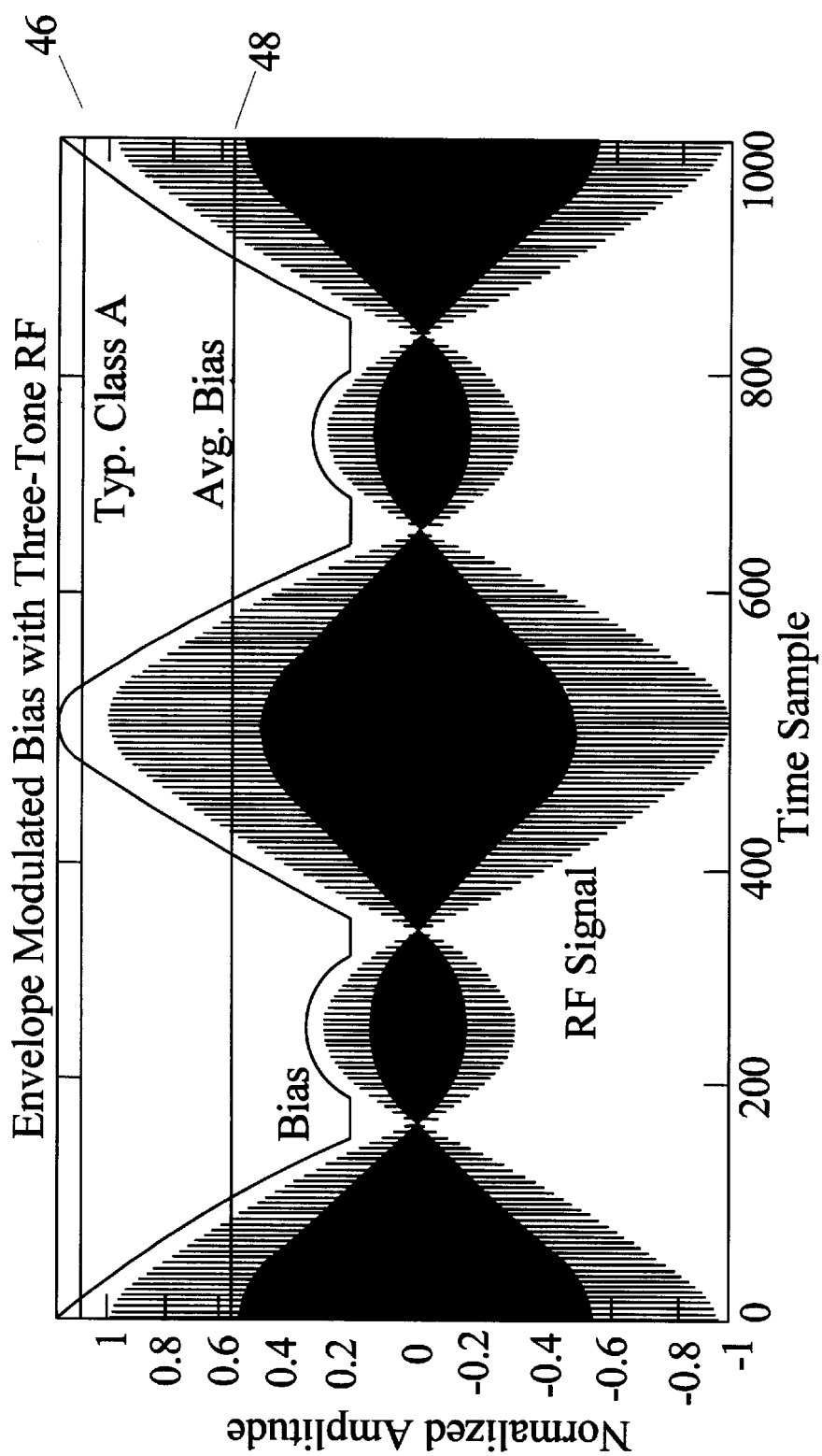
FIG. 6 is a graphical illustration of a three tone RF signal and its associated envelope modulated bias control showing both typical and average bias.

The effects of the control can readily be seen in FIGS. 5 and 6. With reference to FIG. 5 where a two tone RF signal is illustrated, the typical constant Class A bias current is illustrated at line 40. The dynamic bias is illustrated in line 42 and produces an average bias current as illustrated in line 44.

The energy savings are more noticeable in the three tone RF signal illustrated in FIG. 6, where the fixed bias Class A bias is illustrated in line 46 and the average bias is illustrated by line 48.

Relative to Class A operation, Class C amplifiers with the low quiescent bias are generally more efficient. However, the performance thereof is improved by the reduction in intermodulation and harmonic distortion which results from varying the bias current dynamically.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of reducing the power requirements for Class A operation of a RF amplifier comprising the steps of:
   (a) sensing the envelope of the RF signal being amplified; and
   (b) modifying the power consumed by the amplifier by modifying the amplifier bias current in response to the sensed envelope.

2. The method of claim 1 wherein the current through the amplifier is sensed by a resistor between the voltage supply and the active element in the amplifier.

3. The method of claim 1 wherein the current through the amplifier is sensed by a resistor between the active element in the amplifier and ground.

4. The method of claim 1 wherein the power consumed by the amplifier is also modified by the steps of:
   sensing the energy in the RF envelope; and
   modifying the voltage of the power supply in response to the sensed energy.

5. A method of improving the linearity for Class C operation of a RF amplifier comprising the steps of:
   (a) sensing the envelope of the RF signal being amplified; and
   (b) modifying the power consumed by the amplifier by modifying the amplifier bias current in response to the sensed envelope.

6. A method of dynamically biasing a RF amplifier comprising the steps of:
   (a) sensing the envelope of the RF signal being amplified; and
   (b) modifying the power consumed by the amplifier by modifying the amplifier bias current in response to the sensed envelope.

7. A method of reducing power consumption in an RF amplifier comprising the steps of:
   (a) sensing the envelope of the RF signal being amplified; and
   (b) modifying the power applied to the amplifier by modifying the amplifier a bias current in response to the sensed envelope.

8. In an RF amplifier having an input terminal, an output terminal, bias and a source of power:
   means for sensing the envelope of the RF signal applied to the input terminal;
   means for modifying the power applied to the amplifier responsive to said sensing means, said means for modifying including a means for varying the bias current of the amplifier.

9. The amplifier of claim 8 wherein said energy sensing means includes:
   an envelope detector;
   a power supply current sensor;
   an error amplifier for comparing the sensed current with the detected envelope;
   a pulse width modulator responsive to said error amplifier for applying a signal to control the voltage of said source of power.

10. The amplifier of claim 9 wherein said power consumption varying means includes:
    means for varying the bias of the amplifier in response to said envelope detector; and
    means for sensing the energy in the envelope of the RF signal and for varying the potential of said source of power in response to said envelope detector.

* * * * *